(12) United States Patent
Nguyen

(10) Patent No.: US 6,444,039 B1
(45) Date of Patent: Sep. 3, 2002

(54) THREE-DIMENSIONAL SHOWERHEAD APPARATUS

(75) Inventor: Tue Nguyen, Fremont, CA (US)

(73) Assignee: Simplus Systems Corporation, Fremont, CA (US)

(*) Notice: Subject to any disclaimer, the term of this patent is extended or adjusted under 35 U.S.C. 154(b) by 0 days.

(21) Appl. No.: 09/520,108

(22) Filed: Mar. 7, 2000

(51) Int. Cl.[7] .............................. C23L 16/00; C23F 1/02
(52) U.S. Cl. ................................. 118/715; 156/345.34
(58) Field of Search ...................... 118/715; 156/345.34

(56) References Cited

U.S. PATENT DOCUMENTS

| | | | | |
|---|---|---|---|---|
| 4,820,371 A | * | 4/1989 | Rose | 156/345 |
| 4,993,358 A | * | 2/1991 | Mahawili | 118/715 |
| 5,106,453 A | * | 4/1992 | Benko et al. | 156/613 |
| 5,532,190 A | * | 7/1996 | Goodyear et al. | 437/225 |
| 5,552,017 A | * | 9/1996 | Jang et al. | 156/643.1 |
| 5,614,026 A | | 3/1997 | Williams | |
| 5,624,498 A | | 4/1997 | Lee et al. | |
| 5,670,218 A | | 9/1997 | Baek | |
| 5,741,363 A | | 4/1998 | VanBuskirk | |
| 5,954,887 A | * | 9/1999 | Hatano | 134/2 |
| 6,050,506 A | * | 4/2000 | Guo et al. | 239/558 |
| 6,059,885 A | * | 5/2000 | Ohashi et al. | 118/730 |
| 6,265,311 B1 | * | 7/2001 | Hautala et al. | 438/680 |

FOREIGN PATENT DOCUMENTS

| | | | |
|---|---|---|---|
| JP | 55-166926 | * | 12/1980 |
| JP | 60-189928 | * | 9/1985 |
| JP | 61-5515 | * | 1/1986 |
| JP | 61-79773 | * | 4/1986 |
| JP | 10-64831 | * | 6/1998 |
| JP | 11-279778 | * | 10/1999 |

OTHER PUBLICATIONS

Bui, V.Q. Et Al, Etch Gas Distribution Manifold for Plasma Reactor, Sep. 1984, IBM Technical Disclosure Bulletin, vol. 27, No. 4A, P. 1978.*

* cited by examiner

Primary Examiner—Jeffrie R. Lund

(57) ABSTRACT

A vapor supply apparatus, for use in a semiconductor device manufacturing process, provides a three-dimensional showerhead for supplying various precursors to a reaction chamber. The three-dimensional showerhead comprises an inverted-cup structure having double walls, an outer wall and an inner wall, with the double walls defining a first interior volume and the inner wall defining an exterior cavity, the inverted-cup structure further has a plurality of first inlet ports connected to the outer wall for introducing first precursors into the first interior volume and a plurality of first outlet ports at the inner wall for discharging the first precursor vapor from the first interior volume to the exterior cavity. The three-dimensional showerhead confines the precursor vapor inside the external cavity to modify the processed film characteristics.

11 Claims, 7 Drawing Sheets

THREE-DIMENSIONAL SHOWERHEAD APPARATUS

FIELD OF THE INVENTION

This invention relates to an apparatus for use in the integrated circuit (IC) fabrication processes and, more particularly to a three-dimensional showerhead for use in delivery of precursors to a substrate.

BACKGROUND OF THE INVENTION

Two of the most fundamental processes in IC fabrication are chemical vapor deposition (CVD) and etching. CVD processes use vapor precursors for the deposition of thin films on an IC substrate, while etching processes use vapor precursors for the etching of thin films on an IC substrate. The basic differences between CVD and etching processes are the precursors used and the process conditions applied, since the reaction systems used in both processes are similar. Basically, the reactor used for both processes consists of a precursor delivery system, a substrate and an energy source to decompose the precursor vapor to a reactive species to allow a thin film to form on the substrate (CVD process) or to etch an existing thin film on the substrate (etch process). Effective power sources are heat and plasma energy such as radio frequency (RF) power, microwave energy (MW) power, low frequency (10 KHz–1 MHz) power, optical energy (e.g. a laser or ultraviolet light) to decompose the introduced precursors. Also, the substrate could be biased or heated (100° C.–1200° C.), often in the case of CVD processes, to promote the reaction of the decomposed atoms or molecules and to control the physical properties of the formed films.

The precursor delivery system often consists of a showerhead-type disperser for the introduction of precursor vapor into the reactor. The showerhead could incorporated a heat transfer structure whereby the temperature of the precursors is controllably maintained at the desired temperature level for efficient operation. Precursors are the chemical compounds that could be brought together in a reactor chamber. The reactive precursors either decompose or react with each other under a catalyst or an energy source. Non-reactive precursors such as helium, nitrogen, argon sometimes are used to dilute the reactive precursors or to provide a curtain wall. The precursors should be in the gaseous state before reaching the substrate to ensure uniform coating (CVD) or uniform etching (etching system), and to allow efficient molecular interaction. Outside the reaction chamber, the precursors could be in gaseous, liquid or solid state. Gaseous state precursors are the simplest form in IC processing since no extra work will be involve in the delivery of the precursors to the substrate. Liquid precursors require a vaporizer to convert to the gaseous state before exiting the showerhead. Solid precursors also need to be converted into the gaseous state. A vaporizer is normally a heated plate where the thermal energy supplied can vaporize the liquid precursor at the inlet and release vapor precursor at the outlet.

FIG. 1 is a prior art schematic diagram showing a typical showerhead. The showerhead consists of the body structure 6, enclosing an interior volume 8. The precursor enters through the inlet port 3, disperses in the interior volume 8 by the baffle 5, and exits through the outlet ports 4 to the wafer 18, sitting on top of the substrate 1. The heater 2 is used to maintain the showerhead at the desired temperature. The basic structure of the showerhead is the flat surface 7 in parallel to the substrate 1. The precursor flow 20 is in one direction only which is perpendicular to the flat surface 7. A significant portion of the unreacted precursor is lost through the gap between the showerhead bottom surface 7 and the substrate 1. Various designs of the showerhead exist in the literature, but all of them have a flat bottom surface containing the outlet ports, therefore significant precursor loss is inevitable.

FIG. 2 is another prior art schematic diagram described by Yong Ku Baek (U.S. Pat. No. 5,670,218) to focus the precursor onto the substrate. The showerhead has a baffle guide 9, surrounding the substrate 1 and the showerhead. This baffle guide 9 serves to prevent the precursor from the showerhead from diffusing too widely or from leaking into a vacuum port too rapidly. This design helps reduce precursor loss, but with the complexity of a separate baffle guide. Furthermore, uniform heating of the showerhead and the baffle guide is difficult or complex. In fact, Yong Ku Back has not attempted to provide a heater element for his showerhead system. Also the precursor flow is in one direction only.

Another important aspect of the process reactor, be it a CVD system or an etching system, is the heating of the reactor walls to prevent precursor condensation or moisture absorption. In both prior art showerhead designs, separate heated reactor walls are needed to confine the showerhead and the substrate.

It would be advantageous if the precursor flow from the showerhead has more than one direction to further mixing of the precursor.

It would be advantageous if a showerhead could minimize the precursor loss during delivery to the substrate.

It would be advantageous if a showerhead could confine the precursor vapor within the reaction zone.

It would be advantageous if a showerhead could be efficiently heated.

It would be advantageous if a showerhead could function as the reaction container to simplify the reactor design.

It would be advantageous if a showerhead could offer a vapor curtain wall to further confine the precursor inside the reaction zone.

Accordingly, a three-dimensional showerhead for a vapor supply apparatus is provided. The three-dimensional showerhead comprises an inverted-cup structure having double walls, an outer wall and an inner wall, said double walls defining a first interior volume and said inner wall defining an exterior cavity, said structure further having:

a plurality of first inlet ports connected to said outer wall for introducing first process precursors into said first interior volume;

a plurality of first outlet ports at said inner wall for discharging the first precursor vapor from said first interior volume to said exterior cavity.

The invention provides a three-dimensional showerhead covering all directions except the direction covered by the substrate. Accordingly, the precursor vapor exiting from the showerhead will come from all directions except the direction covered by the substrate. The showerhead could be made of metal such as stainless steel, aluminum, or anodized aluminum. The metal showerhead could be used as an electrode in generating a plasma for the reactor. The showerhead could also be made of insulated material such as ceramic. The showerhead could also be made of transparent materials such as glass or quartz to permit the use of a lamp heating system.

In some aspects of the invention, the outlet port dimension ranges from 0.2 mm to 2 mm in diameter. The outlet ports in the horizontal flat area of the showerhead are arranged in such a configuration as to provide uniform delivery of the precursor vapor to the flat portion of the substrate. Concentric circles, repeated polygons such as a hexagon, square, or triangle pattern are some examples of the outlet ports pattern. The outer ports in the vertical walls of the showerhead are arranged in such configuration to optimize the process film quality. In some aspects of the invention, the flow will be horizontal with small openings to create a high velocity gas in the cavity. In some aspects of the invention, the flow will be angled downward to minimize the turbulence in the cavity. The inlet ports are arranged in such configuration to maximize the uniformity of the precursor flow at the outlet. Examples of the configuration could be a single inlet port at the center of the showerhead, or 3 inlet ports arranged in a triangular pattern, or 4 inlet ports arranged in a square pattern.

In some aspects of the invention, a heat transfer structure is included in the showerhead structure to controllably maintain the showerhead at the desired temperature level for efficient operation.

In some aspects of the invention, a baffle is included in the inlet port to diffuse the precursor before exiting to the substrate.

In some aspects of the invention, the three-dimensional showerhead has outlet ports offering flow only in one direction. The side sections of the showerhead will act only as a baffle to contain the precursor vapor. In some aspects of the invention, the side sections, since there is no precursor flowing from it, will be solid.

In some aspects of the invention, the showerhead has smoothed corners to minimize dead space.

In some aspect of the invention, another showerhead with a two zone delivery is provided. The two-zone showerhead comprises a body structure having double walls, an outer wall and an inner wall, said double walls defining a first interior volume and said inner wall defining an exterior cavity, said structure further having:

a partition wall dividing the first interior volume into a first interior volume and a second interior volume;

a plurality of first inlet ports connected to said outer wall for introducing first precursors into said first interior volume;

a plurality of second inlet ports connected to said outer wall for introducing second precursor into said second interior volume;

a plurality of first outlet ports at said inner wall for discharging the first precursor vapor from said first interior volume to said exterior cavity.

a plurality of second outlet ports at said inner wall for discharging the second precursors vapor from said second interior volumes to said exterior cavity.

The invention provides a two-zone showerhead with two separate inlets and two separate outlets.

In some aspect of the invention, another three-dimensional showerhead with a two zone delivery is provided. The two-zone three-dimensional showerhead comprises an inverted-cup structure having double walls, an outer wall and an inner wall, said double walls defining a first interior volume and said inner wall defining an exterior cavity, said structure further having:

a partition wall dividing the first interior volume into a first interior volume and a second interior volume;

a plurality of first inlet ports connected to said outer wall for introducing first precursors into said first interior volume;

a plurality of second inlet ports connected to said outer wall for introducing second precursor into said second interior volume;

a plurality of first outlet ports at said inner wall for discharging the first precursor vapor from said first interior volume to said exterior cavity.

a plurality of second outlet ports at said inner wall for discharging the second precursors vapor from said second interior volumes to said exterior cavity.

The invention provides a two-zone three-dimensional showerhead with two separate inlets and two separate outlets. The two-zone three-dimensional showerhead shares the two-zone feature with the two-zone showerhead and shares the three-dimensional feature with the three-dimensional showerhead.

In some aspects of the invention, the central outlet ports provide the active precursor vapor for the process and the outside outlet ports provide the purging gas needed to contain the active precursor. In some aspects of the invention, the flow of the outside ports is be horizontal with small openings to further contain the precursor within the reaction cavity. In some aspects of the invention, the flow of the outside ports is angled downward to minimize the turbulence in the cavity and further the purging action.

In some aspects of the invention, the outlet port dimension ranges from 0.2 mm to 2 mm in diameter. The outlet ports in the horizontal flat area of the showerhead are arranged in such configuration as to have uniform delivery to the flat portion of the substrate. Concentric circles, repeated polygons such as a hexagon, square, or triangle pattern are some examples of the outlet ports pattern. The inlet ports are arranged in such configuration to maximize the uniformity of the precursor flow at the outlet. Example of the configuration could be a single inlet port at the center of the showerhead, or 3 inlet ports arranged in a triangular pattern, or 4 inlet ports arranged in a square pattern.

In some aspects of the invention, a heat transfer structure is included in the showerhead structure to controllably maintain the showerhead at the desired temperature level to eliminate condensation of precursor vapors within the showerhead.

In some aspects of the invention, a baffle is included in the inlet ports to diffuse the precursor before exiting to the substrate.

With the three-dimensional showerhead, there might not be a need for the reactor chamber body since the showerhead comprises a large portion of the chamber already. Therefore an application of the three-dimensional showerhead is the simplification of the reactor chamber. However, a complete reactor chamber could still be used to provide a cooler wall for safety purposes.

In a co-pending application entitled "Processing method using three-dimensional showerhead systems" invented by Tue Nguyen, a method of delivery of the precursor using the three-dimensional showerheads is disclosed. The method comprises the steps of:

a) introducing the precursor to the showerhead;

b) delivering the precursor vapor to the substrate.

In some aspects of the invention a further step precedes Step a), of heating the showerhead to the desired temperature.

In some aspects of the invention a further step after Step b), of applying a power source to generate a plasma between the showerhead and the substrate.

In some aspects of the invention a two-zone showerhead is used.

In some aspects of the invention a two-zone three-dimensional showerhead is used.

DETAIL DESCRIPTION OF THE PREFERRED EMBODIMENTS

In the following description, for the purposes of explanation and not limitation, specific details are described to provide a thorough understanding of the invention. However, it will be apparent to one skilled in the art that the present invention might be practiced in other embodiments that depart from these specific details.

Figure 1:
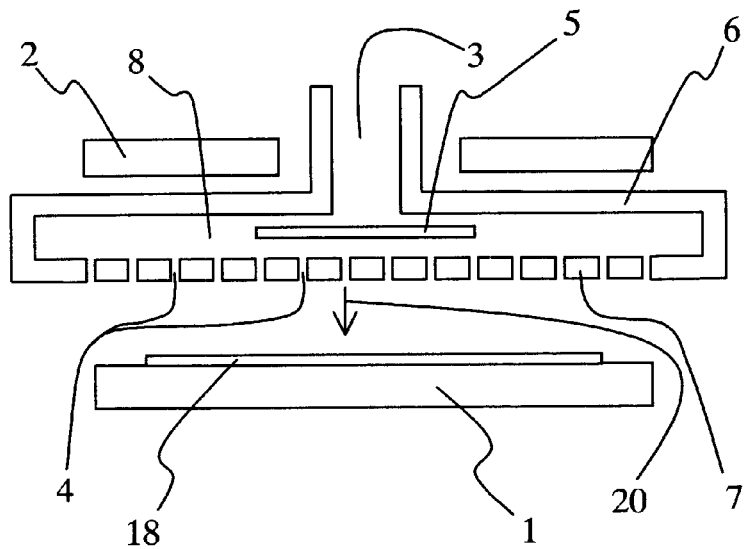
FIG. 1 is a schematic of a prior art showerhead.
Figure 2:
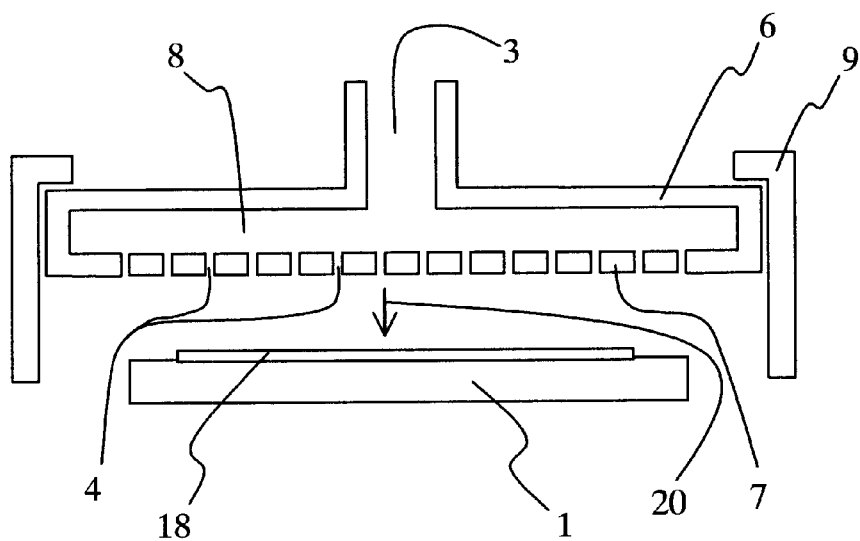
FIG. 2 is a schematic of a prior art showerhead with a baffle guide.
Figure 3:
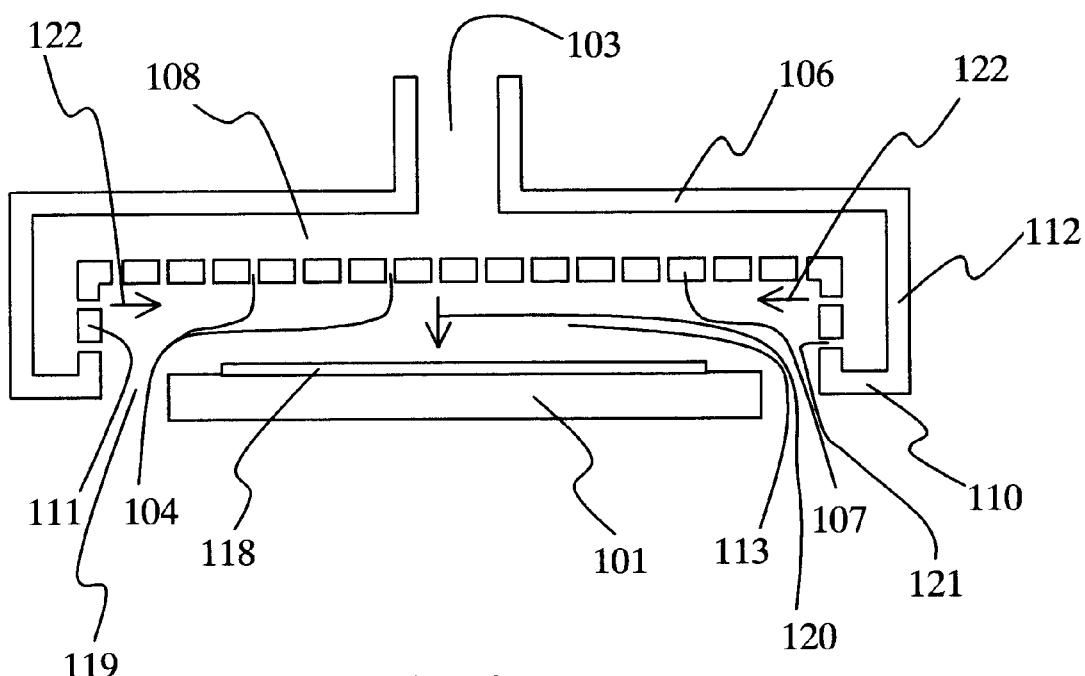
FIG. 3 depicts the present invention three-dimensional showerhead.

FIG. 3 illustrates a three-dimensional showerhead according to one embodiment of the invention. The showerhead is composed of an inverted-cup body consisting of the top outer wall 106, side outer wall 112, bottom wall 110, top inner wall 107, and side inner wall 111. Said inverted-cup body defines an interior volume 108 of the showerhead. The inverted-cup also defines an exterior cavity 113 covered by the top inner wall 107, and side inner wall 111. The precursor is introduced into the interior volume 108 of the showerhead through the inlet port 103, and exits to the external cavity 113 and onto the wafer 118 on top of the substrates support 101. The gap 119 from the showerhead to the substrate support 101 is also controllable to further confine the precursor inside the reaction zone. In some aspects of the invention, there are a plurality of inlet ports 103 to improve the distribution of the precursor released to the exterior cavity 113, especially when the showerhead is large. Pending patent application Ser. No. 09/169,819 "Manifold vaporization system and method" of the same inventor has disclosed the method to improve the distribution of the precursor by using more than one inlet ports. Typical distribution of the multiple inlet ports is concentric circles or polygon patterns. With 3 inlet ports, the pattern is triangular. With 4 inlet ports, the pattern is square. With 7 inlet ports, the pattern is hexagonal with a center inlet port.

The precursor is released to the exterior cavity 113 before reaching the wafer 118 through the vertical outlet ports 104 and the horizontal outlet ports 121. This showerhead permits precursor flow in the vertical direction 120 and the horizontal direction 122. The outlet ports 104 and 121 have a diameter small enough to ensure a pressure difference between the interior volume 108 and the exterior cavity 113. This pressure difference will result in the evenly distributed precursor through the outlet ports. The outlet ports are typically perpendicular to the wall. In some aspects of the invention, the horizontal outlet ports 121 at the inner side wall 111 are directed downward. The direction of the outlet ports 121 at the inner side wall 111 is designed to optimize the processed film quality. To maximize the confinement of the precursor in the exterior cavity 113, the showerhead has perpendicular outlet ports to the inner side wall 111. To achieve more laminar flow, the showerhead has downward direction of the outlet ports at the inner side wall 111.

Figure 4:
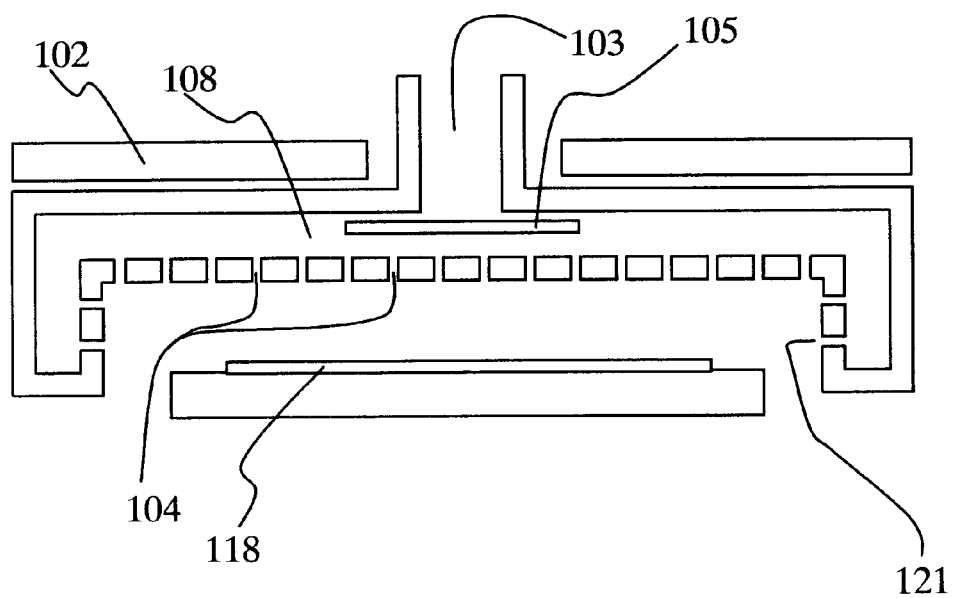
FIG. 4 shows the three-dimensional showerhead with a heat transfer structure and an inlet port baffle.

FIG. 4 illustrates the three-dimensional showerhead with a heat transfer structure 102 and a baffle 105. All other features are similar to the showerhead of FIG. 3. The heat transfer structure 102 serves to controllably maintain the showerhead at the desired temperature for efficient operation. Some precursors, especially the metal-organic precursors such as copper(hfac)L with L is a ligand such as trimethylvinylsilane, tetrakisdimethylaminetitanium (TDMAT), tetrakisdiethylaminetitanium (TDEAT), pentadiethylaminetantalum (PDMAT), condense at room temperature. Therefore the showerhead is heated above room temperature to prevent condensation. Another purpose of the heated showerhead is to maintain a warm wall environment for desorption of condensable gases that could adversely affect the chemical reaction process.

In some aspects of the invention, the showerhead further includes a baffle 105 to diffuse the precursor at the inlet port 103, to prevent a high flow of the precursor exiting at the center of the showerhead. To prevent condensation, the baffle 105 is also heated. The simplest form of heating is to get some heat transfer from the showerhead body. With proper design, the baffle 105 should achieve thermal equilibrium with the rest of the showerhead.

Figure 5:
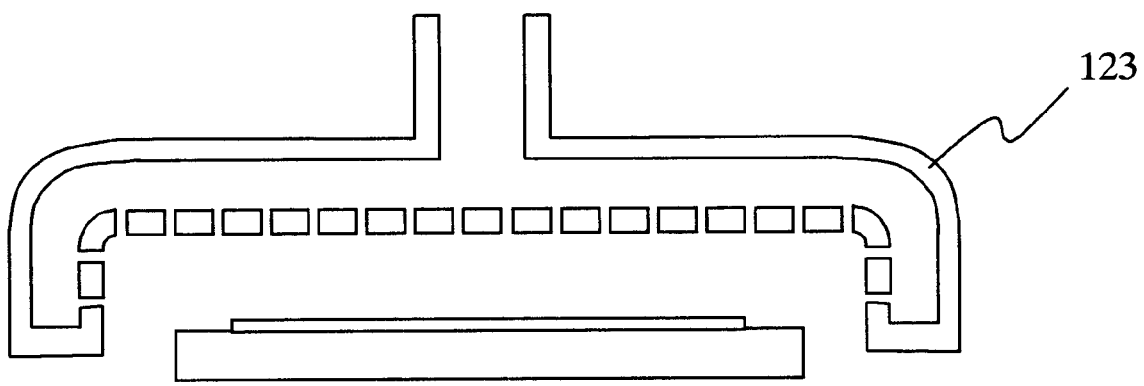
FIG. 5 shows a variation of the three-dimensional showerhead with smooth corners.

FIG. 5 shows a variation of the showerhead with smooth corners 123. The smooth corners 123 serve to minimize the dead space in the interior volume of the showerhead and the exterior cavity. When using the showerhead as a electrode for a plasma power source, the smooth corners also help minimize the high electric field concentration associated with sharp corners.

Figure 6:
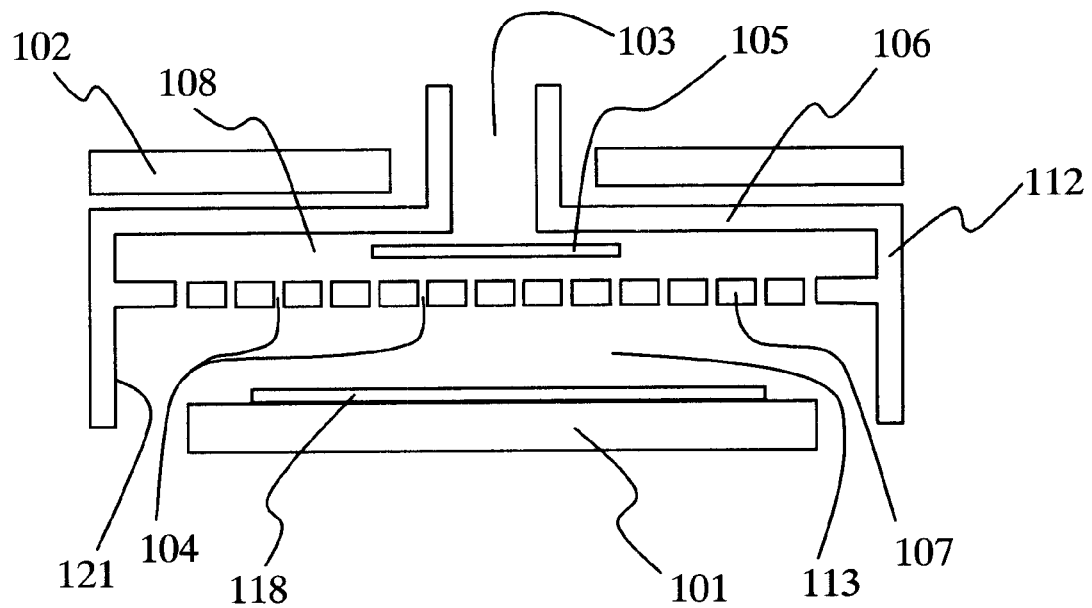
FIG. 6 shows a variation of the three-dimensional showerhead with one direction flow, together with a heat transfer structure and an inlet port baffle.

FIG. 6 illustrates a variation of the three-dimensional showerhead. Similarly, the showerhead is composed of an inverted-cup body consisting of the top outer wall 106, side top wall 112, top inner wall 107, and side bottom wall 121. Said inverted-cup body defines an interior volume 108 of the showerhead. The inverted-cup also defines an exterior cavity 113 covered by the top inner wall 107, and side bottom wall 121. The precursor is introduced into the interior volume 108 of the showerhead through the inlet port 103, and exits to the external cavity 113 and onto the wafer 118. The heat transfer structure 102 serves to controllably maintain the showerhead to the desired temperature for efficient operation. Baffle 105 serves to diffuse the precursor at the inlet port 103, to prevent a high flow of the precursor exiting at the center of the showerhead. To prevent condensation, the baffle 105 is also heated. The outlet flow of this structure is only in one downward direction.

Figure 7:
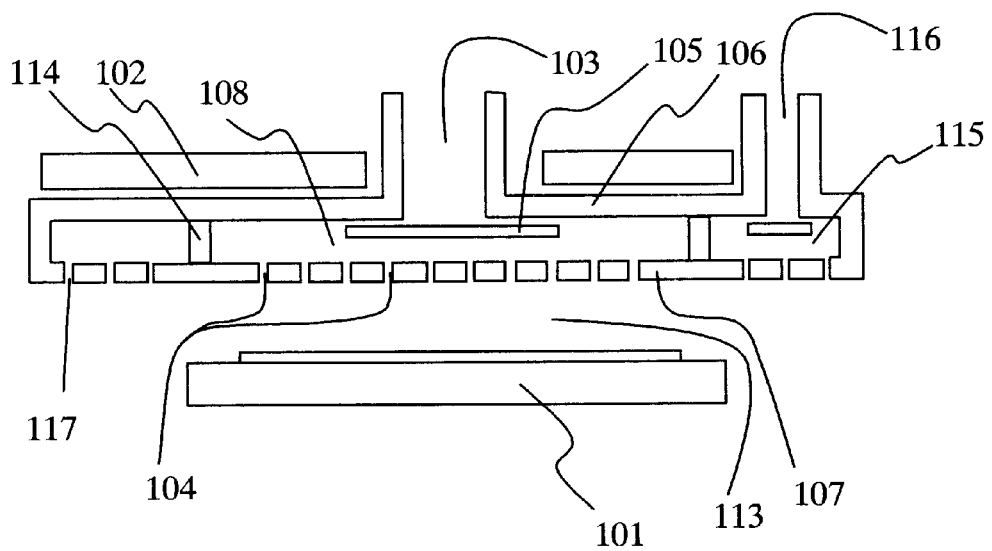
FIG. 7 shows the present invention two-zone showerhead with two zone inlet ports together with a heat transfer structure and inlet port baffles.

FIG. 7 illustrates the two-zone showerhead. The showerhead is composed of a flat body consisting of the top outer wall 106, and bottom wall 107. Together with divider 114, the flat body defines an inner interior volume 108 and an outer interior volume 115 of the showerhead. The flat body also defines an exterior cavity 113 covered by the top inner wall 107, and substrate support 101. The first precursor is introduced into the inner interior volume 108 of the showerhead through the inlet port 103, and exits to the external cavity 113 and onto the substrates support 101. The second precursor is introduced into the outer interior volume 115 through the inlet port 116, and exits to the external cavity 113 and onto the substrate support 101. The heat transfer structure 102 serves to controllably maintain the showerhead at the desired temperature for efficient operation. Baffle 105 serves to diffuse the precursor at the inlet port 103, to prevent a high flow of the precursor exiting at the center of the showerhead. To prevent condensation, the baffle 105 is also heated.

To prevent precursor loss from the side of the cavity 113, the second outlet ports serve as a gas curtain. In some aspects of the invention, the second precursor consists of non-reactive gas such as helium, nitrogen, argon to confine the precursor inside the reaction zone.

Figure 8:
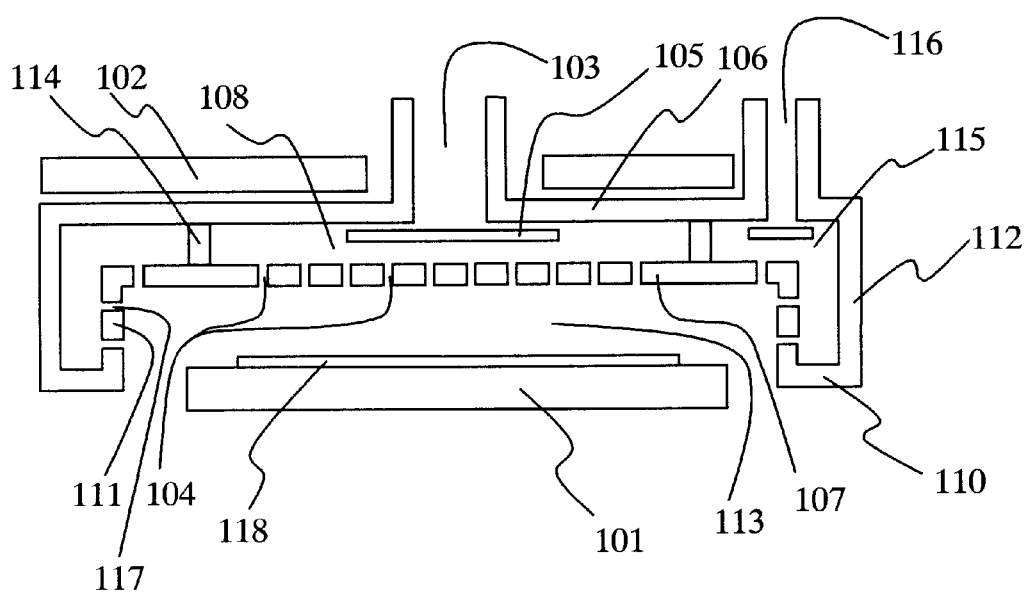
FIG. 8 shows the present invention two-zone three-dimensional showerhead with two zone inlet ports together with a heat transfer structure and inlet port baffles.

FIG. 8 illustrates the two-zone three-dimensional showerhead. Similarly, the showerhead composes of an inverted-cup body consisting of the top outer wall 106, side outer wall 112, bottom wall 110, top inner wall 107, and side inner wall 111. Together with divider 114, the inverted-cup body defines an inner interior volume 108 and an outer interior volume 115 of the showerhead. The inverted-cup also defines an exterior cavity 113 covered by the top inner wall 107, and side inner wall 111. The first precursor is introduced into the inner interior volume 108 of the showerhead through the inlet port 103, and exits to the external cavity 113 and onto the substrate support 101. The second precursor is introduced into the outer interior volume 115 through the inlet port 116, and exits to the external cavity 113 and onto the substrate support 101. The heat transfer structure 102 serves to controllably maintain the showerhead at the desired temperature for efficient operation. Baffle 105 serves to diffuse the precursor at the inlet port 103, to prevent a high flow of the precursor exiting at the center of the showerhead. To prevent condensation, the baffle 105 is also heated.

In some aspects of the invention, the second precursor is a purge gas, serving to confine the first precursor inside the external cavity 113.

Figure 9:
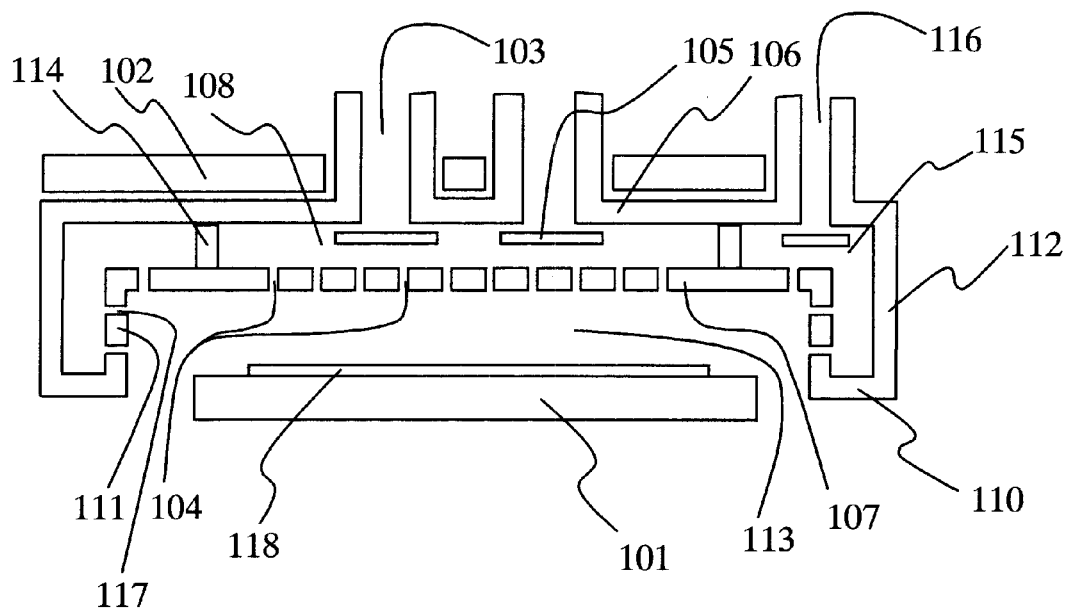
FIG. 9 shows a three-dimensional showerhead the 2 inlet ports.

FIG. 9 illustrates the two-zone three-dimensional showerhead with 2 inlet ports for the inner zone. Separate baffles serve to diffuse the precursor at each separate inlet port.

Figure 10:
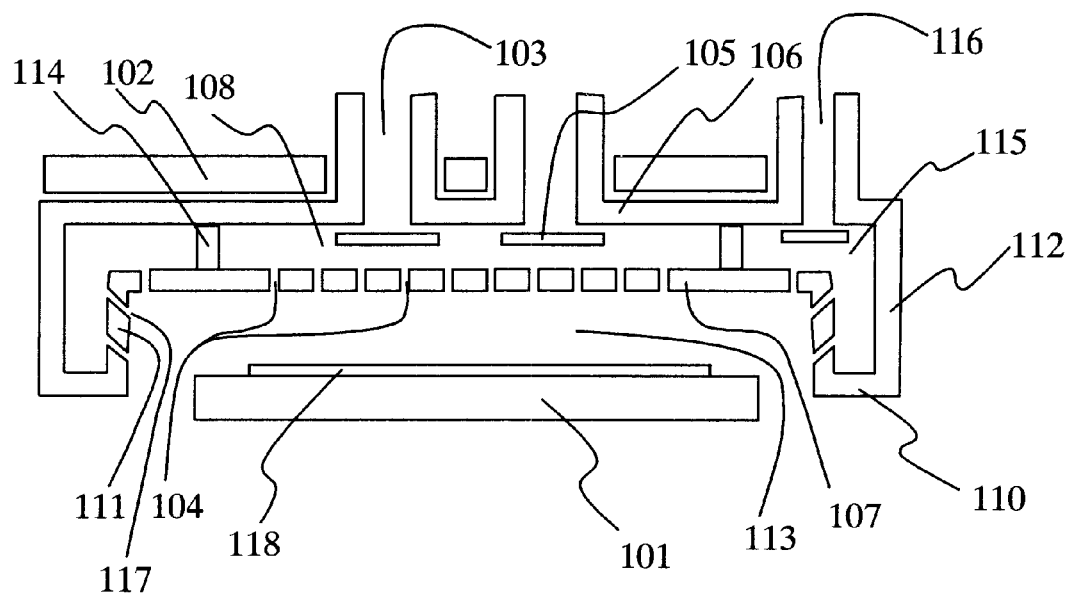
FIG. 10 shows a variation of the three-dimensional showerhead with two zone inlet ports, having the second zone outlet ports facing downward.

FIG. 10 illustrates another variation of the two-zone three-dimensional showerhead with 2 inlet ports for the inner zone. The second zone outlet ports 117 are directed downward to confine the first precursor in the external cavity 113 and not interfere with the reaction of the first precursor.

Figure 11:
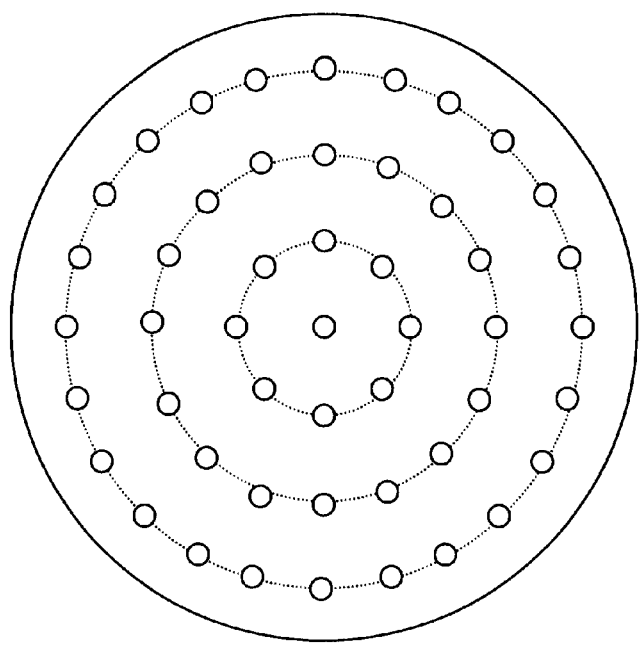
FIG. 11 shows a circular outlet port pattern.

FIG. 11 shows the concentric ring pattern of the outlet ports for the horizontal flat portion of the top inner wall 107. The outlet ports diameter ranges from 0.2 mm to 2 mm. The number of concentric ring ranges from 5 to 40.

Figure 12:
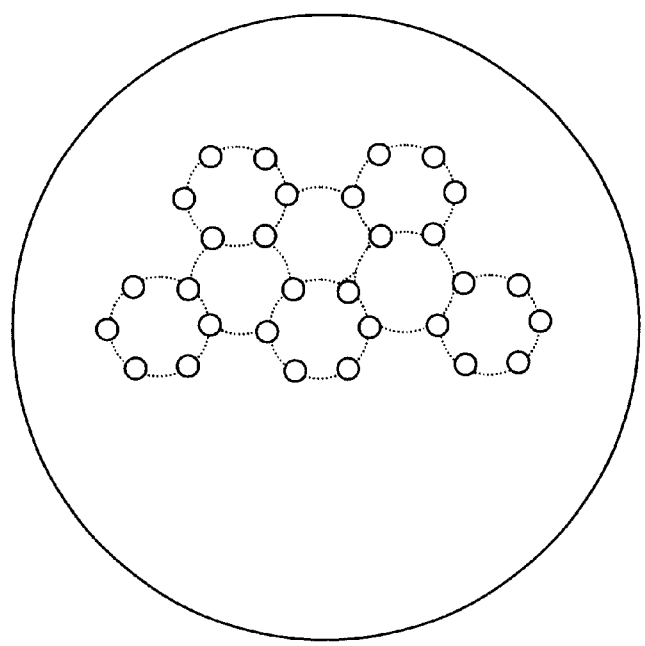
FIG. 12 shows a portion of a repeated hexagonal outlet port pattern.

FIG. 12 shows the hexagonal pattern of the outlet ports. The diameter of the hexagonal ranges from 5 mm to 20 mm.

Figure 13:
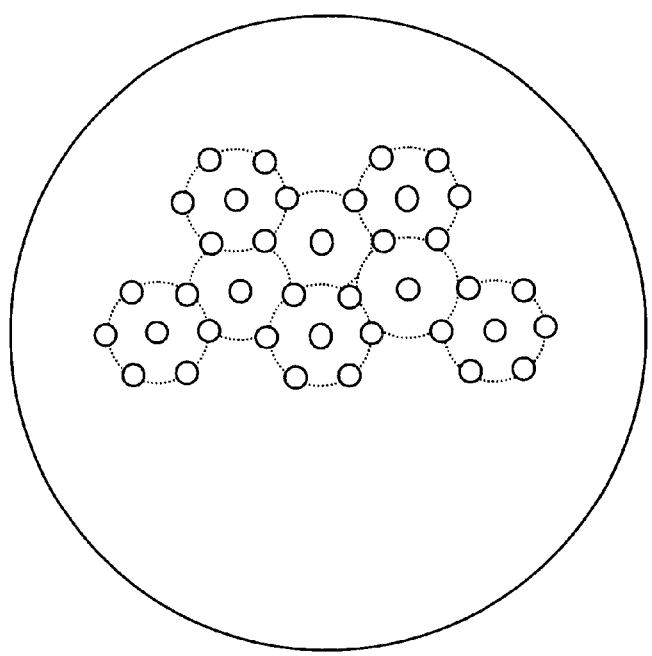
FIG. 13 shows a portion of a repeated triangular outlet port pattern.

FIG. 13 shows the triangular pattern of the outlet ports. The distance between 2 adjacent inlet ports ranges from 2 mm to 15 mm.

Figure 14:
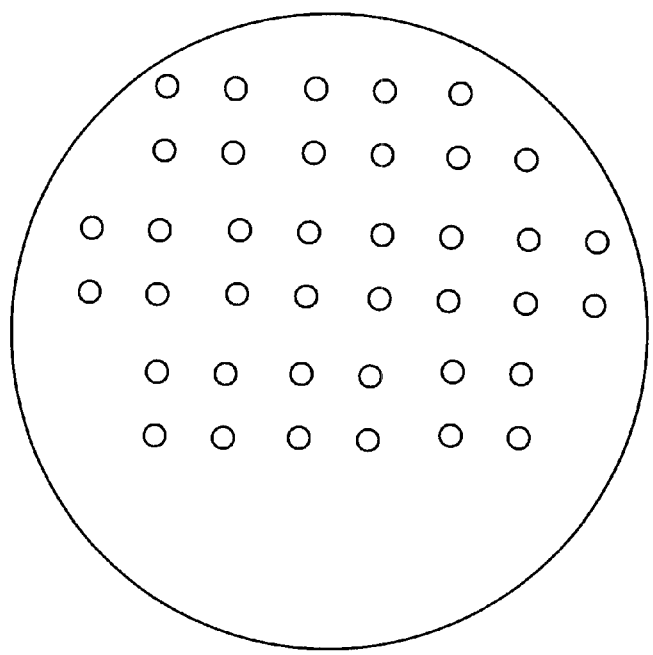
FIG. 14 shows a portion of a repeated square outlet port pattern.

FIG. 14 shows the square pattern of the outlet ports. The distance between 2 adjacent inlet ports ranges from 2 mm to 15 mm.

What is claimed is:

1. A three-dimensional showerhead for a vapor supply apparatus comprising an inverted-cup structure having double walls, an outer wall and an inner wall, said inner wall having a horizontally positioned top inner wall and a vertically positioned side inner wall, said double walls defining a first interior volume and said inner wall defining an exterior cavity, said structure further having:

a plurality of first inlet ports connected to said outer wall for introducing first precursors into said first interior volume;

a plurality of first outlet ports positioned on said horizontally positioned top inner wall and said vertically positioned side inner wall of said inner wall for discharging the first precursor vapor from said first interior volume to said exterior cavity.

2. A showerhead as in claim 1 further including a means to heat said showerhead to the first temperature.

3. A showerhead as in claim 1 further including a baffle plate at the inlet ports to diffuse the inlet precursor.

4. A showerhead as in claim 1 wherein the outlet ports having a concentric circles pattern.

5. A showerhead as in claim 1 wherein the outlet ports having a repeated polygonal pattern.

6. A two-zone showerhead for a vapor supply apparatus comprising a body structure having double walls, an outer wall and an inner wall, said inner wall having a horizontally positioned top inner wall and a vertically positioned side inner wall, said double walls defining a first interior volume and said inner wall defining an exterior cavity, said structure further having:

a partition wall dividing said first interior volume into a first interior volume and a second interior volume;

a plurality of first inlet ports connected to said outer wall for introducing first precursors into said first interior volume;

a plurality of second inlet ports connected to said outer wall for introducing second precursors into said second interior volume;

a plurality of first outlet ports at said inner wall for discharging the first precursor vapor from said first interior volume to said exterior cavity.

a plurality of second outlet ports at said inner wall for discharging the second precursors vapor from said second interior volumes to said exterior cavity.

7. A showerhead as in claim 6 further including a means to heat the showerhead to the first temperature.

8. A showerhead as in claim 6 further including a baffle plate at the inlet ports to diffuse the inlet precursor.

9. A two-zone three-dimensional showerhead as in claim 6 wherein said body structure is an inverted-cup structure.

10. A showerhead as in claim 9 further including a means to heat the showerhead to the first temperature.

11. A showerhead as in claim 9 further including a baffle plate at the inlet ports to diffuse the inlet precursor.

* * * * *